United States Patent
Tseng et al.

(10) Patent No.: US 7,026,091 B2
(45) Date of Patent: Apr. 11, 2006

(54) POSITIVE PHOTORESIST COMPOSITION AND PATTERNING PROCESS USING THE SAME

(75) Inventors: Wei-Chan Tseng, Tainan (TW); Tsing-Tang Song, Taipei (TW); Chih-Shin Chuang, Hsinchu (TW); Kuen-Yuan Hwang, Taipei (TW); An-Pang Tu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/896,536

(22) Filed: Jul. 22, 2004

(65) Prior Publication Data

US 2005/0019691 A1    Jan. 27, 2005

(30) Foreign Application Priority Data

Jul. 22, 2003    (TW) ............................... 92119922 A

(51) Int. Cl.
*G03F 7/023*    (2006.01)
(52) U.S. Cl. ..................... 430/170; 430/189; 430/191; 430/192; 430/270.1; 430/326; 430/905; 430/910
(58) Field of Classification Search ................ 430/170, 430/189, 191, 192, 270.1, 905, 910
See application file for complete search history.

(56) References Cited

U.S. PATENT DOCUMENTS 5,976,760 A * 11/1999 Oomori et al. .......... 430/270.1
6,787,290 B1 * 9/2004 Nitta et al. .............. 430/288.1

* cited by examiner

*Primary Examiner*—John S. Chu
(74) *Attorney, Agent, or Firm*—Thomas, Kayden, Horstemeyer & Risley

(57) ABSTRACT

A positive photoresist with uniform reactivity for use in a thick film lithography process, includes thermal curing during soft-baking and photo dissociation through UV exposure. The positive photoresist comprises a phenolic resin, a resin with acid labile groups, a photoacid generator (PAG), and a reactive monomer with vinyl ether or epoxy group. First, the resins react with the reactive monomer to perform a thermal curing step by soft-baking to form network polymers. In the UV lithography process, the exposed network polymers perform both deprotection and depolymerization simultaneously and are rendered alkali-soluble. The resulting photoresist patterns have a high aspect ratio and resolution profile, due to the good alkali dissolution contrast and uniform reactivity.

19 Claims, 5 Drawing Sheets

POSITIVE PHOTORESIST COMPOSITION AND PATTERNING PROCESS USING THE SAME

BACKGROUND OF THE INVENTION

1. Field of the Invention

The invention relates to a positive photoresist composition and method of pattern forming using the same. More particularly, the present invention relates to a positive photoresist composition with uniform reactivity and method of pattern forming using the same.

2. Description of the Related Art

As semiconductor devices are scaled down, lithography is required for achieving higher integration with device design. To conform to various electronics and optoelectronics requirements, circuit board technology is evolving toward high density interconnection (HDI), fine pitch, and high aspect ratio.

Thick film photolithography employing negative photoresists has been widely used in semiconductor fabrication. Typical resolution can range from 10~50 µm lines and spaces at a film thickness of 10~50 µm range. The circuit board requires a greater number of layers to accommodate the longer circuit and increased number of I/O points. Moreover, as electronic products become thinner and smaller, high density interconnection (HDI) substrates are the primary method of reducing manufacturing cost while maintaining the desired product size. Thus, thick film photoresist resolution must be approached to at least 10~25 µm. Due to the low resolution, however, the application of thick film photolithography employing negative photoresists is limited.

Theoretically, the use of positive photoresist can facilitate forming a thick photoresist pattern with high resolution in the photolithography process, thereby reducing defects for subsequent a via hole pattern formation, in comparison with negative photoresist. In general, the conventional positive photoresist compositions can be classified as either diazonaphthoquinone-novolac (DNQ/Novolac) type resists (non-chemically amplified type resists) or chemically amplified type resists depending on the exposure source thereof. The DNQ/Novolac positive photoresists, however, have an optimum resolution of 0.35~5 µm with 0.5~5 µm thickness, and the chemically amplified positive photoresists have an optimum resolution of 0.3~0.09 µm with 0.2~0.5 µm thickness.

When a conventional positive photoresist composition is employed in a thick film lithographic process, exposure of the photoresist layer poses the problem of transmittance degradation caused by absorption in the photoresist, due to a thickness of the photoresist layer being more than 5 µm. The difference of exposure dose between the top and bottom of the photoresist layer would be huge, such that residual materiel on the bottom of the photoresist layer is difficult to remove after development. The residual photoresist creates uneven surfaces due to defects such as distortion, swelling or raising, resulting from incomplete reaction of photoresist composition. Hence, the photolithography resolution of the positive photoresist is limited.

A chemically amplified resin reacts with acid molecules generated by a photoacid generator after exposure to irradiate and catalytically deprotect acid labile groups of the chemically amplifyed resin. During deprotection, the exposed chemically amplifyed resin releases $H^+$ which facilitates the deprotection and further reduces activation energy required of the photoacid generator. Accordingly, chemically amplified resin is often employed by positive photoresist for high sensitivity and lowering the exposure energy. However, the obtained chemically amplified photoresist pattern has a low photoresist contrast resulting in uneven profiles, due to inferior dissolution inhibition and reaction uniformity of chemically amplified resin.

As electronic products become thinner and smaller, high density interconnection (HDI) substrates are the primary method of reducing manufacturing cost while maintaining the desired product size. Thus, thick film photoresist resolution must be approached to at least 10~25 µm. Therefore, developing a simple photoresist technology offering a complete figure, high aspect ratio, and superior resolution is necessary.

SUMMARY OF THE INVENTION

Accordingly, an object of the present invention is to provide a photoresist composition with uniform reactivity. The photoresist composition according to the present invention is positive and alkali-insoluble and comprises multi-component resins, a photo acid generator (PAG), and a reactive monomer with vinyl ether (or epoxy) group. In a UV lithography process, the multi-component resins and the reactive monomer are first thermally cured by soft-baking to form network polymers with superior dissolution inhibition. After UV radiation, the exposed network polymers undergo deprotection and depolymerization simultaneously becoming hydrophilic and alkali-soluble, resulting in uniform and controllable reactivity of the photoresist composition.

The positive photoresist composition can be used with low exposure energy to obtain thick film photoresist layer, preventing from the defects resulting from light scattering during exposure and incomplete reaction of photoresist composition. Hence, the positive photoresist has a high aspect ratio and resolution profile, due to the good alkali dissolution contrast and uniform reactivity.

Another object of the present invention is to provide a method of forming a photoresist pattern using the positive photoresist composition according to the present invention to substantially prevent problems resulting from the limitations and disadvantages of conventional methods.

To achieve the object, the positive photoresist composition with a uniform reactivity according to the present invention comprises an organic solvent, a phenolic resin, a resin with acid labile groups, a reactive monomer with vinyl ether or epoxy groups, and a photoacid generator.

In addition, the present invention provides a method of pattern forming using the previously described photoresist composition, comprising the following steps. A photoresist film is first formed on a substrate using a positive photoresist composition according to the present invention. Next, the photoresist film is subjected to a pre-exposure baking (soft-baking) to perform a cross-link reaction and obtain network polymers. Next, the photoresist film with a predetermined pattern is exposed to an actinic ray or radiation. Finally, the photoresist film is developed with an alkaline developing solution to remove the exposed photoresist film and form a photoresist pattern.

In the present invention, the choice of actinic ray is unlimited and can be uniform ultraviolet light with a wavelength of about 365 nm.

A detailed description is given in the following embodiments with reference to the accompanying drawings

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1A:
FIGS. 1a to 1b are scanning electron microscope (SEM) photographs of the resist pattern as disclosed in First Comparative Example 1.

In order to further understand the present invention, the components of the positive photoresist composition are described in the following.

According to the present invention, the phenolic resin employed in the present invention can be phenol formaldehyde resin, p-cresol formaldehyde resin, o-cresol formaldehyde resin, m-cresol formaldehyde resin or derivatives thereof. In addition, the phenolic resin can be polymers according to formula (I), as follows.

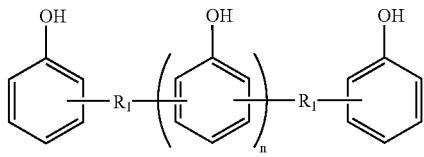

Wherein R1 can be the same or different and is an alkylene group, arylene group, cycloalkylene group alkylarylene group, such as —CH2—,

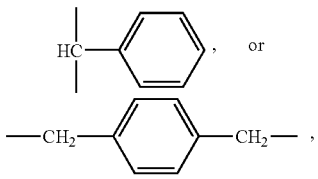

wherein the alkylene group, arylene group, cycloalkylene group, or alkylarylene group can be straight or branched and have 1 to 12 carbon atoms, and n can be an integer of 2 to 100, preferably 2 to 30.

In addition, at least one hydrogen atom bonded to the carbon atom of the phenolic resin according to formula (I) can be substituted optionally by a halogen atom, cyano group, —R", $CO_2H$, —$CO_2R"$, —R"$CO_2H$, —COR", —R"CN, —$CONH_2$, —CONHR", —$CONR"_2$, —OCOR", or —OR", wherein R" can be a saturated or unsaturated alkyl group having 1 to 12 carbon atoms, thioalkyl group, alkynyloxy group, heterocycloalkyl group, alkoxy group, ester group, alkenyl group, alkynylene group, alkenyloxy group, heterocycloalkyl group, aryl group, alkylaryl group, heteroaryl group, arylalkyl group, or combinations thereof.

The resin with acid labile groups suitable for use in the present invention can be acrylate resin with acid labile groups, poly hydroxy styrene (PHS) with acid labile groups, or derivatives thereof. Specifically, the acid labile group is a functional group which is decomposed in the presence of acid to release positive charge and be rendered to a functional group exhibiting alkali solubility. The acid labile group can be tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-butoxyethyl, 1-tert-butoxyethyl, 1-isobutoxyethyl, tert-butoxycarbonyl, tert-butoxycarbomethyl, trimethylsilyl, 3-tert-butyl-dimethylsilyl, 2-acetylmenth-1-yl or derivatives thereof. In addition, the resin with acid labile groups is preferably present in an amount of 0.1–100 parts by weight, and most preferably 1–40 parts by weight, based on 100 parts by weight of the phenolic resin.

Furthermore, the resin with acid labile groups can be selected from the group consisting of homopolymers, copolymers, and derivatives thereof, in which the homopolymers and the copolymers can be synthesized by at least one monomer selected from the group consisting of tetraethylene glycol diacrylate, tetraethylene glycol dimethacrylate, neopentylglycol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethylolpropane triacrylate, pentaerythritol triacrylate, thoxylated trimethylolpropane triacrylate, glyceryl propoxy triacrylate, pentaerythritol tetraacrylate, dipentaerythritol pentaacrylate, glycidyl acrylate, glycidylmethyl acrylate, and derivatives thereof.

The reactive monomer suitable for use in the present invention can be a reactive monomer with vinyl ether or epoxy groups. The reactive monomer with vinyl ether groups can be 1,4-cyclohexane dimethanol diglycidyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, hexane diol divinyl ether, ethylene glycol divinyl ether, diethylene glycol divenyl ether, triethylene glycol divinyl ether, 1,4-cyclohexane dimethanol divinyl ether, lactones or derivatives thereof. Furthermore, the reactive monomer with epoxy groups can be cycloaliphatic epoxide, such as N,N-diglycidyl-4-glycidyloxyaniline, 3,4-epoxycyclohexylmethyl carboxylate, 3,4-epoxycyclohexane carboxylate, 1,2-cyclohexane diglycidyl dicarboxylate or derivatives thereof. In addition, the reactive monomer is preferably present in an amount of 0.1–100 parts by weight, most preferably 1–35 parts by weight, based on 100 parts by weight of the phenolic resin.

The photoacid generator suitable for use in the present invention is not particularly specific and can be any photoacid generator which produces acids by decomposition due to irradiation, such as onium salt, triarylsulfonium salt, alkylarylsulfonium salt, diarylodonium salt, diarylchloronium salt, diarylbromonium salts, sulfonates, diazonium salt, diazonaphthoquinone sulfonate, and combinations thereof. The examples of triarylsulfonium salt include, but are not limited to, triaryl sulfonium hexafluorophosphate, triphenyl triflate, triphenyl stibnite, methoxy triphenyl triflate, methoxy triphenyl stibnite, and trimethyl triphenyl triflate. In addition, the photoacid generator is preferably present in an amount of 0.1–35 parts by weight, most preferably 1–20 parts by weight, based on 100 parts by weight of the phenolic resin.

According to the present invention, the phenolic resin and the resin with acid labile groups employed in the present invention have molecular weights of between 2,000 and 150,000, preferably between 3,000 and 100,000. Furthermore, the resins employed in the present invention preferably have a wide molecular weight distribution, in order to obtain a photoresist composition with superior dissolution inhibition. Moreover, in the present invention, the weight ratio between the resin with acid labile groups and the phenolic resin can be 1:6 to 1:1.

While the essential ingredients in the photoresist composition according to the present invention are the above described components, the inventive photoresist composition can be optionally admixed with an additive, such as dissolution inhibitor, antioxidant, thermo-stabilizer, light stabilizer, lubricant, defoamer, planarization reagent, filler, thickener or mixture thereof. In addition, the additive is preferably present in an amount of 1–100 parts by weight, based on 100 parts by weight of the phenolic resin.

The present invention is novel in that the positive photoresist composition is subject to a pre-exposure baking to induce a cross-link reaction and obtain network polymers, wherein the alkali-insoluble net polymers are simultaneously deprotected and depolymerized by introduced acid resulting in rendered alkali-soluble compounds. A feature of the present invention is that the positive photoresist composition includes essential components belonging to both non-chemically amplified and chemically amplified positive photoresists. Furthermore, the amounts of each component in the positive photoresist composition are designed within a particular range, resulting in superior dissolution inhibition and reaction uniformity.

The following comparative embodiments and embodiments are intended to illustrate the invention more fully without limiting their scope, as numerous modifications and variations will be apparent to those skilled in the art.

COMPARATIVE EXAMPLE 1

A cresol formaldehyde resin (A) (sold and manufactured under the trade number of D_PD-193A by Borden Co., Ltd) having a molecular weight of 3300 was dissolved in γ-butyrolactone to prepare a resin solution with a resin content of about 66.6%. A mixture of 25.0 g of the obtained resin solution, and 2.72 g of poly hydroxy styrene (PHS) with tert-butyl substituent groups base resin was added into a round-bottom flask at room temperature and subjected to a dissolution process with ultrasonic agitation.

After dissolving completely, 0.27 g of triaryl sulfonium hexafluorophosphate (50% in Propylene Carbonate) (SarCat®KI85) were added to the resulting mixture. After mixing completely, a conventional positive photoresist was provided.

The ingredients and amounts of the above photoresist composition are shown in Table 1.

TABLE 1

| Component | Wt % |
| --- | --- |
| D_PD-193A | 35.73 |
| PHS | 9.72 |
| SarCat ® KI85 | 0.97 |
| γ-butyrolactone | 53.58 |

The photoresist composition as described above was coated on a copper clad laminate with a thickness of 10 μm and subjected to a soft baking at 80° C. for 10 min. The photoresist patterns were designed respectively with a line/space resolution of 15 μm and 20 μm to obtain a 1:1 line/space ratio. After exposure to uniform ultraviolet light with a wavelength of about 365 nm and exposure energy of 200 mJ/cm$^2$, the sample was subjected to a post-exposure baking at 120° C. for 10 min and developed by 2.38% tetr-amethylammonium hydroxide (TMAH) solution with ultrasonic agitation at 30° C. for 300 seconds to dissolve the exposed area.

Figure 1B:
Figure 2A:
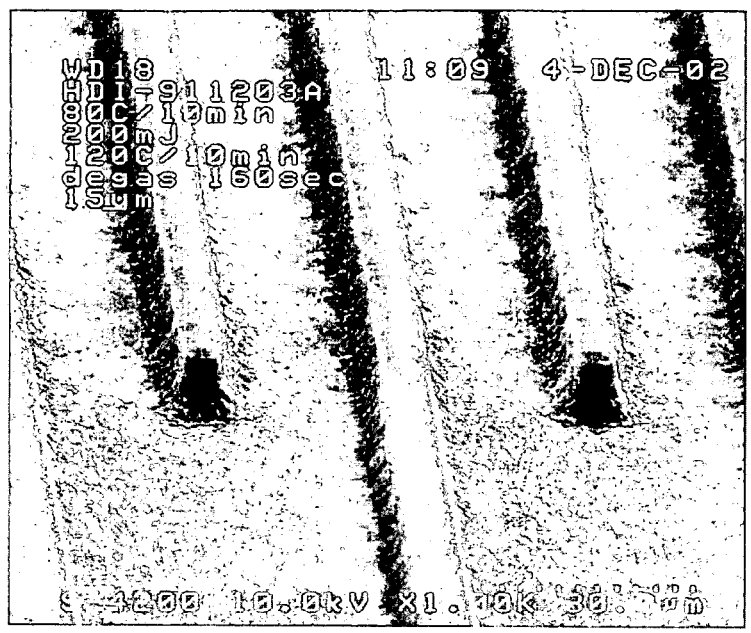
FIGS. 2a to 2b are scanning electron microscope (SEM) photographs of the resist pattern as disclosed in Second Comparative Example 2.
Figure 2B:
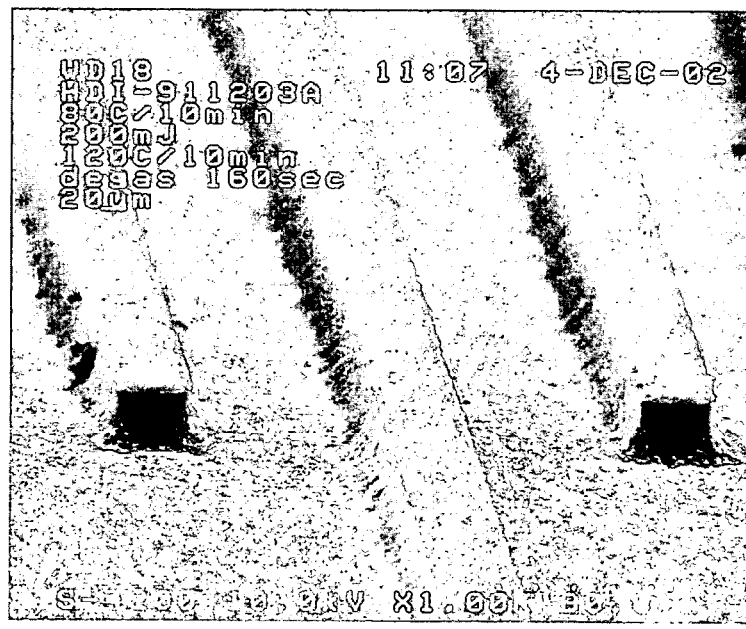

The resist pattern after development was subjected to a scanning electronic microscopy (SEM) photographic observation. As shown in FIGS. 1a and 1b, the obtained photoresist patterns had line widths of 10.5 μm and 15 μm respectively, and 15 μm and 20 μm with pre-determined designs. Individual line/space ratios were 1/1.8 and 1/1.6. In addition, photoresist defects, such as swelling and rising, were clearly observed in the SEM photographs of Comparative Example 1.

COMPARATIVE EXAMPLE 2

8 g of cresol formaldehyde resin (A) (sold and manufactured under the trade number of D_PD-193A by Borden Co., Ltd) having a molecular weight of 3300 and 2 g of cresol formaldehyde resin (B) (sold and manufactured under the trade number of D_PD-140A by Borden Co., Ltd) having a molecular weight of 6000~8500 were dissolved in 15 g γ-butyrolactone to prepare a resin solution with a resin content of about 66.6%. The obtained resin solution, and 2.72 g of poly hydroxy styrene (PHS) with tert-butyl substituent groups base resin was added into a round-bottom flask at room temperature and subjected to a dissolution process with ultrasonic agitation.

After dissolving completely, 0.27 g of SarCat®KI85 were added to the resulting mixture. After mixing completely, a conventional positive photoresist was provided.

The ingredients and amounts of the above photoresist composition are shown in Table 2.

TABLE 2

| Component | Wt % |
| --- | --- |
| D_PD-193A | 28.58 |
| D_PD-140A | 7.15 |
| PHS | 9.72 |
| SarCat ® KI85 | 0.97 |
| γ-butyrolactone | 53.58 |

The photoresist composition as described above was coated on a copper clad laminate with a thickness of 10 μm and subjected to a soft baking at 80° C. for 10 min. The photoresist patterns were designed respectively with a line/space resolution of 15 μm and 20 μm to obtain a 1:1 line/space ratio. After exposure to uniform ultraviolet light with a wavelength of about 365 nm and exposure energy of 300 mJ/cm$^2$, the sample was subjected to a post-exposure baking at 120° C. for 10 min and developed by 2.38% TMAH solution with ultrasonic agitation at 35° C. for 160 seconds to dissolve the exposed area.

The resist pattern after development was subjected to a scanning electronic microscopy (SEM) photographic observation. As shown in FIGS. 1a and 1b, the obtained photoresist patterns had line widths of 9.8 μm and 13.3 μm respectively, and 15 μm and 20 μm with pre-determined designs. Individual line/space ratios were 1/2.1 and 1/2. In addition, photoresist defects, such as rising, were clearly observed in the SEM photographs of Comparative Example 2.

The photoresist compositions as disclosed in above Comparative Examples 1 and 2 comprise chemically amplified type photoresist components, thereby lowering the required exposure energy thereof. Due to the resulting photoresist layer with inferior dissolution inhibition, however, the above-mentioned photoresist compositions present a disappointing alkali dissolution contrast. The obtained photoresist patterns had line widths lower than that for pre-determined designs, and the resulting line/space ratio was also substantially different from pre-determined designs.

EXAMPLE 1

A cresol formaldehyde resin (A) (sold and manufactured under the trade number of D_PD-193A by Borden Co., Ltd) having a molecular weight of 3300 was dissolved in γ-butyrolactone to prepare a resin solution with a resin content of about 66.6%. A mixture of 25.0 g of the obtained resin solution, and 2.72 g of poly hydroxy styrene (PHS) with tert-butyl substituent groups base resin was added into a round-bottom flask at room temperature and subjected to a dissolution process with ultrasonic agitation.

After dissolving completely, 0.3 g tri(ethylene glycol) divinyl ether as reactive monomer and 0.27 g of SarCat®KI85 as photoacid generator were added into the resulting mixture. After mixing completely, a positive photoresist according to the present invention was provided.

The ingredients and amounts of the above photoresist composition are shown in Table 3.

TABLE 3

| Component | Wt % |
| --- | --- |
| D_PD-193A | 35.35 |
| PHS | 9.61 |
| SarCat ® KI85 | 0.95 |
| tri (ethylene glycol) divinyl ether | 1.06 |
| γ-butyrolactone | 53.03 |

The photoresist composition as described above was coated on a copper clad laminate with a thickness of 10 μm and subjected to a soft baking at 130° C. for 15 min. The photoresist patterns were designed respectively with a line/space resolution of 10 μm, 15 μm and 20 μm to obtain a 1:1 line/space ratio. After exposure to uniform ultraviolet light with a wavelength of about 365 nm and exposure energy of 200 mJ/cm$^2$, the sample was subjected to a post-exposure baking at 130° C. for 15 min and developed by 2.38% TMAH solution with ultrasonic agitation at 30° C. for 180 seconds to dissolve the exposed area.

Figure 3A:
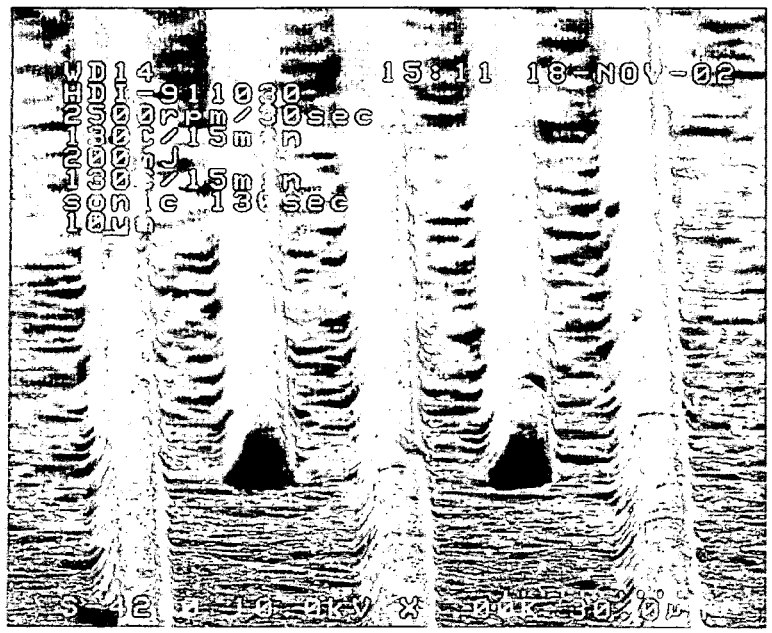
FIGS. 3a to 3c are scanning electron microscope (SEM) photographs of the resist pattern as disclosed in Example 1.
Figure 3B:
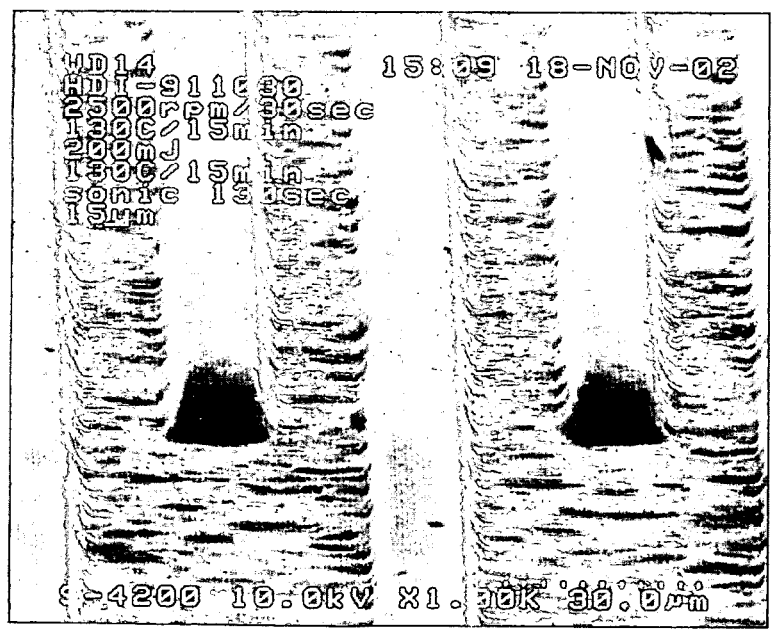
Figure 3C:
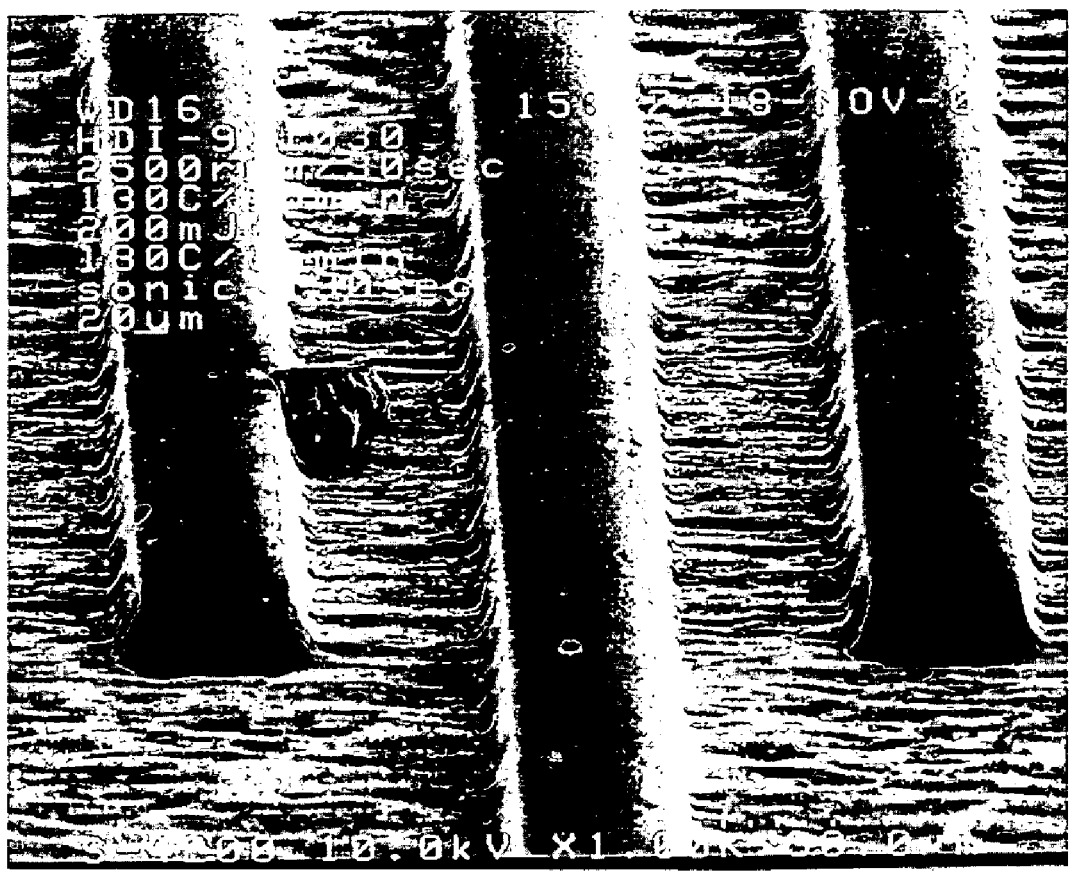

The resist pattern after development was subjected to scanning electronic microscopy (SEM) photographic observation. As shown in FIGS. 3a to 3c, the obtained photoresist patterns had line widths of 9.5 μm, 15 μm, and 20 μm respectively, and 10 μm, 15 μm and 20 μm with pre-determined designs. Individual line/space ratios were 1/1.1, 1/1 and 1/1, corresponding pre-determined designs.

EXAMPLE 2

A cresol formaldehyde resin (A) (sold and manufactured under the trade number of D_PD-193A by Borden Co., Ltd) having a molecular weight of 3300 was dissolved in cyclopentanone to prepare a resin solution with a resin content of about 66.6%. A mixture of 25.0 g of the obtained resin solution, and 2.72 g of poly hydroxy styrene (PHS) with tert-butyl substituent groups base resin was added into a round-bottom flask at room temperature and subjected to a dissolution process with ultrasonic agitation.

After dissolving completely, 0.4 g tri(ethylene glycol) divinyl ether as reactive monomer and 0.27 g of SarCat®KI85 as photoacid generator were added into the resulting mixture. After mixing completely, a positive photoresist according to the present invention was provided.

The ingredients and amounts of the above photoresist composition are shown in Table 4.

TABLE 4

| Component | Wt % |
| --- | --- |
| D_PD-193A | 35.23 |
| PHS | 9.58 |
| SarCat ® KI85 | 0.95 |
| tri (ethylene glycol) divinyl ether | 1.41 |
| cyclopentanone | 52.83 |

The photoresist composition as described above was coated on a copper clad laminate with a thickness of 10 μm and subjected to a soft baking at 130° C. for 15 min. The photoresist patterns were designed respectively with a line/space resolution of 15 μm and 20 μm to obtain a 1:1 line/space ratio. After exposure to uniform ultraviolet light with a wavelength of about 365 nm and exposure energy of 200 mJ/cm$^2$, the sample was subjected to a post-exposure baking at 130° C. for 15 min and developed by 2.38% TMAH solution with ultrasonic agitation at 30° C. for 260 seconds to dissolve the exposed area.

Figure 4A:
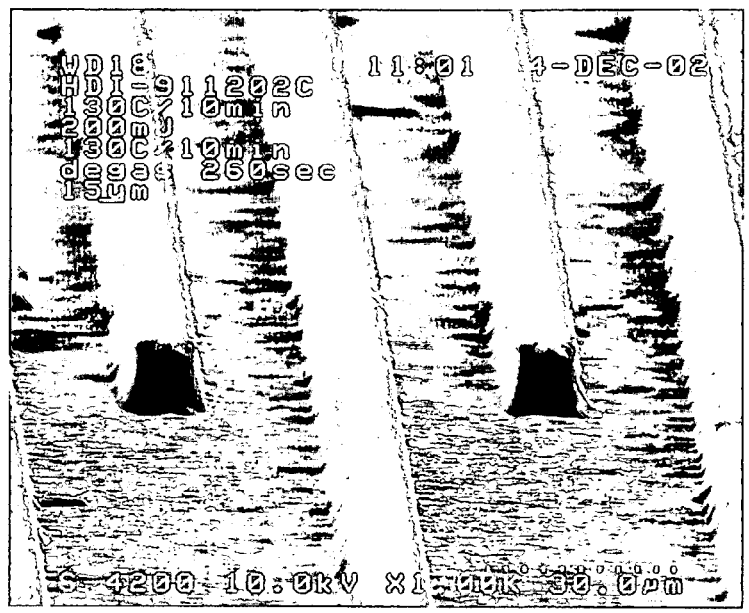
FIGS. 4a to 4b are scanning electron microscope (SEM) photographs of the resist pattern as disclosed in Example 2.
Figure 4B:
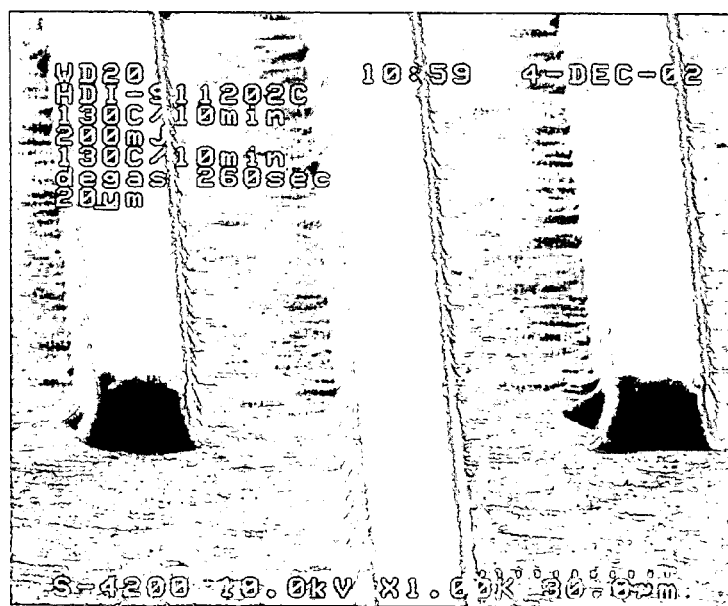

The resist pattern after development was subjected to scanning electronic microscopy (SEM) photographic observation. As shown in FIGS. 4a and 4b, the obtained photoresist patterns had line widths of 14.3 μm and 17 μm, and 20 μm respectively, and 10 μm, 15 μm and 20 μm with pre-determined designs. Individual line/space ratios were 1/1.1 and 1/1.35.

The present invention has the following advantages.

During pre-exposure baking, the positive photoresist composition performs a thermal curing to form alkali-insoluble network polymers. The network polymers are then selectively irradiated, and the exposed network polymers undergo deprotection and depolymerization simultaneously to be rendered alkali-soluble. Due to the above multi-reaction systems, the alkali dissolution contrast of the photoresist composition is improved, and the reactivity of the photoresist composition is also controllable.

When the positive photoresist composition is coated on a printed circuit board to form a photoresist film, subjected to a pre-exposure baking, exposed to UV light according to a predetermined pattern and developed with an alkaline developing solution, a photoresist pattern having excellent cross-sectional profile, high fidelity and alkali resistance is formed. Moreover, high density interconnection substrates with high resolution (10–25 μm) can be obtained by a thick film lithography process employing the positive photoresist composition according to the present invention.

Furthermore, the positive photoresist composition according to the present invention exhibits high photosensitivity. A source of exposure with lower and uniform energy, such as uniform ultraviolet light, can be used to expose the photoresist composition in the photolithography process in order to prevent distortion at the edge line of the photoresist pattern.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A positive photoresist composition, comprising the following components as a uniform solution in an organic solvent:
   a phenolic resin;
   a resin with acid labile groups in an amount of 0.1 to 100 parts by weight, based on 100 parts by weight of the phenolic resin;
   a reactive monomer with vinyl ether or epoxy groups in an amount of 0.1 to 100 parts by weight; and
   a photoacid generator in an amount of 0.1 to 35 parts by weight;
   wherein the phenolic resin has a formula (I), of

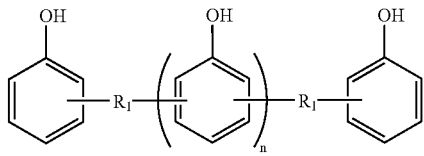

wherein
R1 are the same or different and are an alkylene group, arylene group, cycloalkylene group, alkylarylene group, such as —CH2—,

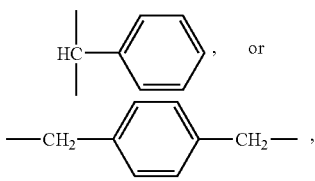

wherein the alkylene group, arylene group, cycloalkylene group, or alkylarylene group is straight or branched and has 1 to 12 carbon atom; and
n is an integer of 2 to 100.

2. The positive photoresist composition as claimed in claim 1, wherein at least one hydrogen atom bonded to the carbon atom of the phenolic resin according to formula (I) is substituted optionally by a halogen atom, cyano group, —R", CO$_2$H, —CO$_2$R", —R"CO$_2$H, —COR", —R"CN, —CONH$_2$, —CONHR", —CONR"$_2$, —OCOR", or —OR", wherein R" can be a saturated or unsaturated alkyl group having 1 to 12 carbon atoms, thioalkyl group, alkynyloxy group, heterocycloalkyl group, alkoxy group, ester group, alkenyl group, alkynylene group, alkenyloxy group, heterocycloalkyl group, aryl group, alkylaryl group, heteroaryl group, arylalkyl group, or combinations thereof.

3. The positive photoresist composition as claimed in claim 1, wherein n is an integer of 2 to 30.

4. The positive photoresist composition as claimed in claim 1, wherein the acid labile group is tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-butoxyethyl, 1-tert-butoxyethyl, 1-isobutoxyethyl, tert-butoxycarbonyl, tert-butoxycarbomethyl, trimethylsilyl, 3-tert-butyl-dimethylsilyl, 2-acetylmenth-1-yl or derivatives thereof.

5. The positive photoresist composition as claimed in claim 1, wherein the resin with acid labile groups is an acrylate resin with acid labile groups.

6. The positive photoresist composition as claimed in claim 1, wherein the resin with acid labile groups is a poly hydroxy styrene (PHS) with acid labile groups.

7. The positive photoresist composition as claimed in claim 1, wherein the resin with acid labile groups is selected from the group consisting of homopolymers, copolymers, and derivatives thereof, in which the homopolymers and the copolymers are synthesized by at least one monomer selected from the group consisting of tetraethylene glycol diacrylate, tetraethylene glycol dimethacrylate, neopentylglycol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethylolpropane triacrylate, pentaerythritol triacrylate, thoxylated trimethylolpropane triacrylate, glyceryl propoxy triacrylate, pentaerythritol tetraacrylate, dipentaerythritol pentaacrylate, glycidyl acrylate, glycidylmethyl acrylate, and derivatives thereof.

8. The positive photoresist composition as claimed in claim 1, wherein the photoacid generator is an onium salt, triarylsulfonium salt, alkylarylsulfonium salt, diaryliodonium salt, diarylchloronium salt, diarylbromonium salts, sulfonates, diazonium salt, diazonaphthoquinone sulfonate, or combinations thereof.

9. The positive photoresist composition as claimed in claim 8, wherein the triarylsulfonium salt is a triaryl sulfonium hexafluorophosphate, triphenyl triflate, triphenyl stibnite, methoxy triphenyl triflate, methoxy triphenyl stibnite, and trimethyl triphenyl triflate or derivatives thereof.

10. The positive photoresist composition as claimed in claim 1, wherein the reactive monomer with vinyl ether groups is 1,4-cyclohexane dimethanol diglycidyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, hexane diol divinyl ether, ethylene glycol divinyl ether, diethylene glycol divenyl ether, triethylene glycol divinyl ether, 1,4-cyclohexane dimethanol divinyl ether, lactones or derivatives thereof.

11. The positive photoresist composition as claimed in claim 1, wherein the reactive monomer with epoxy groups is N,N-diglycidyl-4-glycidyloxyaniline, 3,4-epoxycyclohexylmethyl carboxylate, 3,4-epoxycyclohexane carboxylate, 1,2-cyclohexane diglycidyl dicarboxylate or derivatives thereof.

12. The positive photoresist composition as claimed in claim 1, wherein the phenolic resin and the resin with acid labile groups have molecular weights of between 2,000 and 150,000.

13. The positive photoresist composition as claimed in claim 1, wherein the phenolic resin and the resin with acid labile groups have molecular weights of between 3,000 and 100,000.

14. The positive photoresist composition as claimed in claim 1, further comprising:
an additive in an amount of 1–100 parts by weight, based on 100 parts by weight of the phenolic resin.

15. The positive photoresist composition as claimed in claim 14, wherein the additive is dissolution inhibitor, antioxidant, thermo-stabilizer, light stabilizer, lubricant, defoamer, planarization reagent, filler, thickener or mixture thereof.

16. The positive photoresist composition as claimed in claim 1, wherein the weight ratio between the resin with acid labile groups and the phenolic resin is 1:6 to 1:1.

17. A method of pattern forming using a positive photoresist composition, comprising:
forming a photoresist film on a substrate using a positive photoresist composition;
providing an actinic ray or radiation to expose predetermined patterns of the photoresist film; and
developing the photoresist film with an alkaline developing solution;
wherein
the positive photoresist composition comprises the following components as a uniform solution in an organic solvent:
a phenolic resin;
a resin with acid labile groups in an amount of 1 to 100 parts by weight, based on 100 parts by weight of the phenolic resin;
a reactive monomer with vinyl ether or epoxy groups in an amount of 1 to 100 parts by weight; and
a photoacid generator in an amount of 1 to 35 parts by weight;

wherein the phenolic resin has a formula (I), of

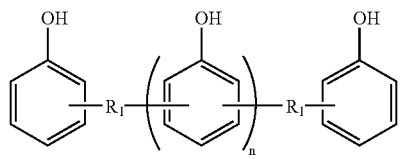

wherein
R1 are the same or different and are an alkylene group, arylene group, cycloalkylene group, alkylarylene group, such as —CH2—,

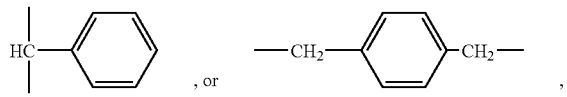

wherein the alkylene group, arylene group, cycloalkylene group, or alkylarylene group is straight or branched and has 1 to 12 carbon atom; and
n is an integer of 2 to 100.

18. The method as claimed in claim 17, after forming a photoresist film on a substrate using a positive photoresist composition, further comprising:
subjecting the photoresist film to a pre-exposure baking to perform a cross-link reaction and obtain net polymers.

19. The method as claimed in claim 18, wherein the net polymers undergo deprotection and depolymerization simultaneously during exposure to the actinic ray or radiation.

* * * * *